(12) United States Patent
Yuan et al.

(10) Patent No.: US 11,042,126 B2
(45) Date of Patent: Jun. 22, 2021

(54) TIME-TO-DIGITAL CONVERTER

(71) Applicant: Huawei International Pte. Ltd., Singapore (SG)

(72) Inventors: Chao Yuan, Singapore (SG); Rui Yu, Singapore (SG); Xuesong Chen, Singapore (SG); Supeng Liu, Singapore (SG); Theng Tee Yeo, Singapore (SG)

(73) Assignee: Huawei International Pte. Ltd., Singapore (SG)

( * ) Notice: Subject to any disclaimer, the term of this patent is extended or adjusted under 35 U.S.C. 154(b) by 0 days.

(21) Appl. No.: 16/900,452

(22) Filed: Jun. 12, 2020

(65) Prior Publication Data
US 2020/0310359 A1    Oct. 1, 2020

Related U.S. Application Data

(63) Continuation of application No. PCT/SG2017/050618, filed on Dec. 14, 2017.

(51) Int. Cl.
*G04F 10/00* (2006.01)
*H03K 3/03* (2006.01)
*H03L 7/085* (2006.01)

(52) U.S. Cl.
CPC ......... *G04F 10/005* (2013.01); *H03K 3/0315* (2013.01); *H03L 7/085* (2013.01)

(58) Field of Classification Search
CPC ...... H03K 3/0315; H03L 7/085; G04F 10/005
(Continued)

(56) References Cited

U.S. PATENT DOCUMENTS 8,031,007 B2    10/2011  Chang et al.
9,306,585 B1 *   4/2016  Elkholy ............... H03L 7/087
(Continued)

FOREIGN PATENT DOCUMENTS

CN    101326470 A    12/2008
CN    102253643 A    11/2011
(Continued)

OTHER PUBLICATIONS

Choi et al., "A Time-to-Digital Converter Based on a Multiphase Reference Clock and a Binary Counter With a Novel Sampling Error Corrector," IEEE Transactions on Circuits and Systems—II: Express Briefs, vol. 59, No. 3, pp. 143-147, Institute of Electrical and Electronics Engineers, New York, New York (Mar. 2012).

(Continued)

*Primary Examiner* — Lam T Mai
(74) *Attorney, Agent, or Firm* — Leydig, Voit & Mayer, Ltd.

(57) ABSTRACT

A time-to-digital converter (TDC) is disclosed, which comprises a ring oscillator module and a digital error correction module. The ring oscillator module is configured to receive a sampling signal, an addressing signal, and a preset signal, and includes: a ring oscillator arranged with a plurality of inverters; a phase sampler configured to sample phase signals generated by the inverters for generating a first output signal; a counter clock generator configured to generate first and second clock signals; first and second counters configured to respectively generate first and second counter output signals; and a data sampler configured to sample the first and second counter output signals to respectively generate second and third output signals. The digital error correction module is arranged to process the first, second and third output signals for generating a digital signal.

11 Claims, 11 Drawing Sheets

(58) Field of Classification Search
USPC .......................................................... 341/166
See application file for complete search history.

(56) References Cited

U.S. PATENT DOCUMENTS

| | | | |
|---|---|---|---|
| 9,698,798 B1* | 7/2017 | Fredenburg | H03L 7/099 |
| 10,819,355 B1* | 10/2020 | Abughazaleh | H03L 7/085 |
| 2005/0259239 A1 | 11/2005 | Lin et al. | |
| 2007/0096836 A1 | 5/2007 | Lee et al. | |
| 2008/0191921 A1* | 8/2008 | Scholz | H03L 7/193 |
| | | | 341/166 |
| 2010/0134165 A1* | 6/2010 | Oh | G04F 10/06 |
| | | | 327/158 |
| 2011/0169673 A1* | 7/2011 | Henzler | G04F 10/005 |
| | | | 341/141 |
| 2015/0077279 A1 | 3/2015 | Song et al. | |
| 2015/0145572 A1* | 5/2015 | Sato | H03L 7/085 |
| | | | 327/159 |
| 2018/0267480 A1* | 9/2018 | Mahajan | G05F 1/561 |
| 2019/0056698 A1* | 2/2019 | Testi | H03L 7/091 |
| 2019/0190525 A1* | 6/2019 | Fredenburg | H03L 7/0802 |
| 2021/0044299 A1* | 2/2021 | Tertinek | H03L 7/091 |

FOREIGN PATENT DOCUMENTS

| | | |
|---|---|---|
| CN | 102369671 A | 3/2012 |
| CN | 105703766 A | 6/2016 |
| CN | 107026647 A | 8/2017 |
| CN | 107077099 A | 8/2017 |

OTHER PUBLICATIONS

Staszewski et al., "1.3 V 20 ps Time-to-Digital Converter for Frequency Synthesis in 90-nm CMOS," IEEE Transactions on Circuits and Systems—II: Express Briefs, vol. 53, No. 3, pp. 220-224, Institute of Electrical and Electronics Engineers, New York, New York (Mar. 2006).

* cited by examiner

TIME-TO-DIGITAL CONVERTER

CROSS-REFERENCE TO RELATED APPLICATIONS

This application is a continuation of International Application No. PCT/SG2017/050618, filed on Dec. 14, 2017, the disclosure of which is hereby incorporated by reference in its entirety.

FIELD

The present disclosure relates to a time-to-digital converter (TDC).

BACKGROUND

Time-to-digital converters (TDCs) have been widely used for more than 20 years in numerous applications requiring precise time-interval measurement. Some examples of the applications include particle and high-energy physics, biomedical imaging (e.g. PET scan), and various time-of-flight (ToF) measurements. Due to the advancement of CMOS technologies, TDCs have also been adopted in All-digital phase-locked loops (ADPLLs) for digital communication systems. By converting time or phase information to digital codes, TDCs have enabled PLLs to evolve towards a fully digital domain to replace conventional analog PLLs. Another emerging field of application for TDCs is TDC-based analog-to-digital converters (ADCs). Although the requirements for TDCs differ for various applications, a set of desired general specifications can be defined to include the following: possess a high-resolution, provide a large-dynamic range, exhibit low-power consumption, and occupy a small IC area. Two types of conventional TDCs are next briefly discussed below.

Inverter-Based Delay-Line TDC

FIG. 1a shows a pseudo-differential flash-type TDC 100 used in a counter-based ADPLL in accordance with the prior art. A high-frequency signal CKV and its complementary signal are first edge-aligned, and passed through a complementary series of 48 inverters. The inverters act as delay elements, and each inverter is configured with a resolution of $T_{inv}$ between 16 ps to 21 ps. Consequently, the CKV signal is eventually delayed by a total time of $kT_{inv}$, after propagating through k number of inverters—see clock timing diagrams 150 in FIG. 1b. The delayed-clock replica vector is subsequently sampled using an array of 48 sense-amplifier-based D flip-flops (SADFF), on receipt of a FREF signal. It can be seen that after passing through each inverter, the polarity of the signal is reversed. To therefore generate the correct output, the positive and negative inputs of 7 adjacent SADFF are to be inverted.

It is to be highlighted that the delay-line TDC 100 typically suffers from a trade-off between resolution and dynamic range. For a fixed number of inverter stages, higher resolution means smaller dynamic range, and vice versa. So to extend the dynamic range, the number of inverter stages has to be increased substantially. But this then results in large power consumption and increases the actual IC area needed for implementing the circuit components of the delay-line TDC 100. Moreover, as the number of inverter stages grows, mismatch among the inverter stages causes severe linearity issue. In addition, the sampling time with different DFFs cannot be perfectly aligned in actual circuit implementation, due to component mismatch. Particularly, the FREF signal is usually transmitted through a buffer tree to be distributed to the DFFs. Any imbalance in the buffer tree may introduce skew for the sampling time of DFFs. The misalignment of the sampling time of different DFFs, and the delay mismatches among the delay cells are thus major sources of non-linearity for the delay-line TDC 100.

Ring Oscillator-Based TDC

A ring-oscillator (RO) based TDC 200 is depicted in FIG. 2. Unlike the delay-line TDC 100, the delay-line in the RO-based TDC 200 is configured in a ring arrangement. The free-running RO, which comprises an odd number of inverters, is used to generate multiple phases at a relative high frequency. The phase from the last stage of the RO is then fed to a high-speed counter, which is configured to run at a high frequency and is switched on constantly. Start and stop signals sample the ring oscillator phases as well as the counter output, respectively. The time difference between the start and stop signals correspond to the eventual TDC output. However, one problem with the RO-based TDC 200 is that the sampled counter output can be erroneous, since the start and stop signals are not synchronized with the counter clock. Moreover, certain assumptions regarding the delay design of the RO-based TDC 200 have been made, which are extremely difficult to satisfy in actual production. As PVT variations and device mismatches come into play, the actual delay time may vary significantly from the target delay time. Hence, there is a high risk that the proposed error correction algorithm (for the RO-based TDC 200) may not work as intended in actual manufacturing environments. Further, the continuous free running arrangement for the RO tends to incur substantial power consumption. Adding to that, the counter is always switched on, which wastes power.

SUMMARY

According to a first aspect of the disclosure, there is provided a time-to-digital converter (TDC) comprising: a ring oscillator module configured to receive a sampling signal, an addressing signal, and a preset signal, the ring oscillator module includes: a ring oscillator arranged with a plurality of inverters; a phase sampler configured to sample phase signals generated by the inverters of the ring oscillator for generating a first output signal, on receipt of the sampling signal; a counter clock generator configured to generate first and second clock signals, based on receipt of the sampling signal and respective phase signals generated by the first and last inverters of the ring oscillator; first and second counters configured to respectively generate first and second counter output signals, based on receipt of the first and second clock signals respectively; and a data sampler configured to sample the first and second counter output signals to respectively generate second and third output signals; and a digital error correction module arranged to process the first, second and third output signals for generating a digital signal representative of a time difference between receipt of a start signal and receipt of a stop signal by the TDC, wherein the ring oscillator is arranged to be operated between first and second modes on receipt of the preset signal, in which in the first mode, the ring oscillator is electrically switched on for a period corresponding to the time difference, and in the second mode, the ring oscillator is electrically switched off by presetting an inverter based on the addressing signal, which includes an identification of the inverter selected to be preset at each conversion cycle of the ring oscillator.

Preferably, in some embodiments, the data sampler may be implemented using a D flip-flops circuit.

Preferably, in some embodiments, the phase sampler may be implemented using a sense-amplifier-based D flip-flops circuit.

Preferably, in some embodiments, the first output signal may include a resultant phase signal based upon the phase signals generated by the inverters.

Preferably, in some embodiments, the TDC may further comprise a digital control module arranged to receive the start and stop signals for generating the sampling signal, the addressing signal, and the preset signal. The digital control module includes: a pseudo-random code generator configured to generate the identification to randomly address one of the inverters of the ring oscillator selected to be preset; and a control signal generator configured to generate the sampling signal and the preset signal.

Preferably, in some embodiments, the identification may be predetermined to preset a same inverter at each conversion cycle.

Preferably, in some embodiments, the digital error correction module may be configured to perform the following step for processing the first, second and third output signals: determining if the phase signal generated by the first inverter has a value of 0 or 1. If the phase signal generated by the first inverter has a value of 0, the third output signal is selected for processing by the digital error correction module, or if the phase signal generated by the first inverter has a value of 1, the second output signal is selected for processing by the digital error correction module, in which the second output signal is further processed using both a value of the phase signal generated by the last inverter and a predefined value associated with a corresponding inverter selected to be preset at each conversion cycle of the ring oscillator, wherein the predefined value is further associated with the identification.

Preferably, in some embodiments, the counter clock generator may include being arranged to stop the phase signals generated by the first and last inverters that are provided to the counter clock generator, in which stoppage of the phase signals is performed based on the sampling signal.

According to a second aspect of the disclosure, there is provided a method of time-to-digital conversion using the TDC of the first aspect. The method comprises: (i) generating the phase signals by the inverters of the ring oscillator; (ii) sampling the phase signals by the phase sampler for generating a first output signal, on receipt of the sampling signal by the ring oscillator module; (iii) generating first and second clock signals by the counter clock generator, based on receipt of the sampling signal and phase signals generated respectively by the first and last inverters of the ring oscillator; (iv) generating first and second counter output signals by the first and second counters, based on receipt of the first and second clock signals respectively; (v) sampling the first and second counter output signals by the data sampler to respectively generate second and third output signals; and (vi) processing the first, second and third output signals by the digital error correction module for generating a digital signal representative of a time difference between receipt of a start signal and receipt of a stop signal by the TDC. The method also includes operating the ring oscillator between first and second modes on receipt of the preset signal, in which in the first mode, the ring oscillator is electrically switched on for a period corresponding to the time difference, and in the second mode, the ring oscillator is electrically switched off by presetting an inverter based on the addressing signal, which includes an identification of the inverter selected to be preset at each conversion cycle of the ring oscillator.

Preferably, in some embodiments, step (vi) may include: determining if the phase signal generated by the first inverter has a value of 0 or 1, wherein if the phase signal generated by the first inverter has a value of 0, the third output signal is selected for processing by the digital error correction module, or if the phase signal generated by the first inverter has a value of 1, the second output signal is selected for processing by the digital error correction module, in which the second output signal is further processed using both a value of the phase signal generated by the last inverter and a predefined value associated with a corresponding inverter selected to be preset at each conversion cycle of the ring oscillator. The predefined value is further associated with the identification.

According to a third aspect of the disclosure, there is provided a time-to-digital converter (TDC) comprising: a ring oscillator module configured to receive a sampling signal, an addressing signal, and a preset signal. The ring oscillator module includes: a ring oscillator arranged with a plurality of inverters; a phase sampler configured to sample phase signals generated by the inverters of the ring oscillator for generating a first output signal, on receipt of the sampling signal; a counter clock generator configured to generate first and second clock signals, based on receipt of the sampling signal and respective phase signals generated by the first and last inverters of the ring oscillator; first and second counters configured to respectively generate first and second counter output signals, based on receipt of the first and second clock signals respectively; and a data sampler configured to sample the first and second counter output signals to respectively generate second and third output signals; a digital error correction module arranged to process the first, second and third output signals for generating a digital signal representative of a time difference between receipt of a start signal and receipt of a stop signal by the TDC, wherein the ring oscillator is arranged to be operated between first and second modes on receipt of the preset signal, in which in the first mode, the ring oscillator is electrically switched on for a period corresponding to the time difference, and in the second mode, the ring oscillator is electrically switched off by presetting an inverter based on the addressing signal, which includes an identification of the inverter selected to be preset at each conversion cycle of the ring oscillator; and a digital control module arranged to receive the start and stop signals, the digital control module includes: a pseudo-random code generator configured to generate the identification to randomly address one of the inverters of the ring oscillator selected to be preset; and a control signal generator configured to generate the sampling signal and the preset signal.

It should be apparent that features relating to one aspect of the disclosure may also be applicable to the other aspects of the disclosure.

These and other aspects of the disclosure will be apparent from and elucidated with reference to the embodiments described hereinafter.

BRIEF DESCRIPTION OF THE DRAWINGS

Embodiments of the disclosure are described hereinafter with reference to the accompanying drawings, in which.

DETAILED DESCRIPTION OF PREFERRED EMBODIMENTS

Figure 1A:
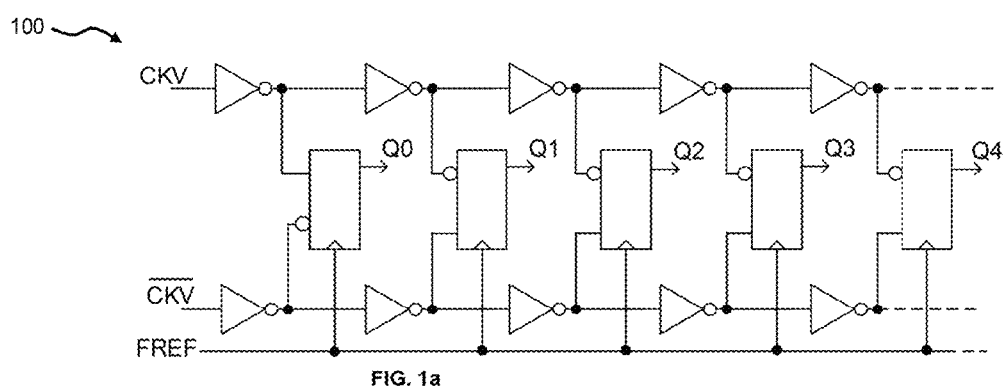
FIG. 1a shows schematics of an inverter-based delay-line time-to-digital converter (TDC)
Figure 1B:
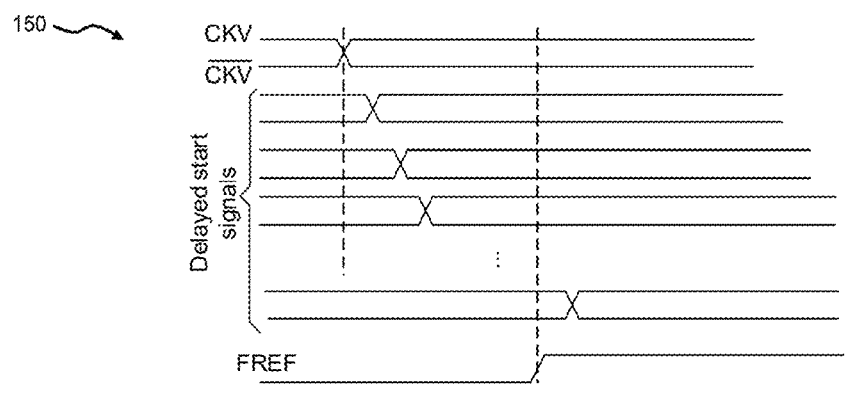
FIG. 1b shows clock timing diagrams of clock signals generated at different stages of the delay-line TDC of FIG. 1a, according to the prior art.
Figure 2:
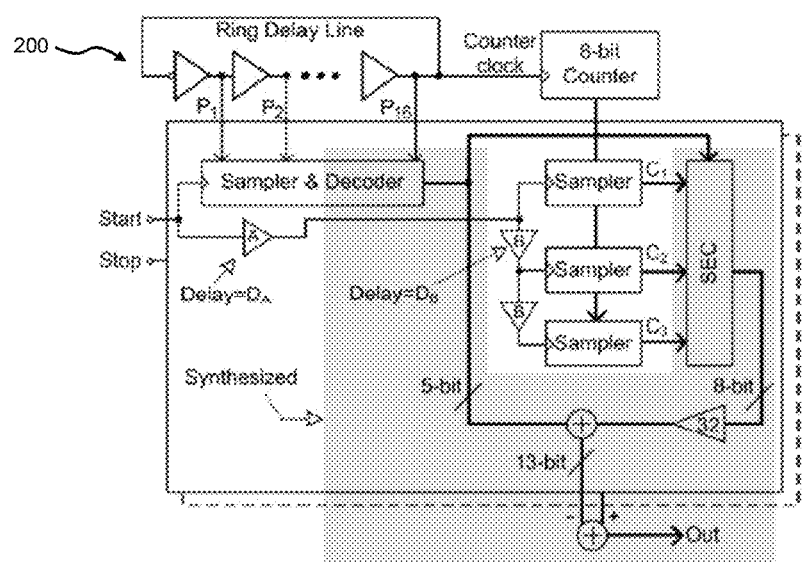
FIG. 2 shows schematics of a ring-oscillator (RO) based TDC, according to the prior art.
Figure 3:
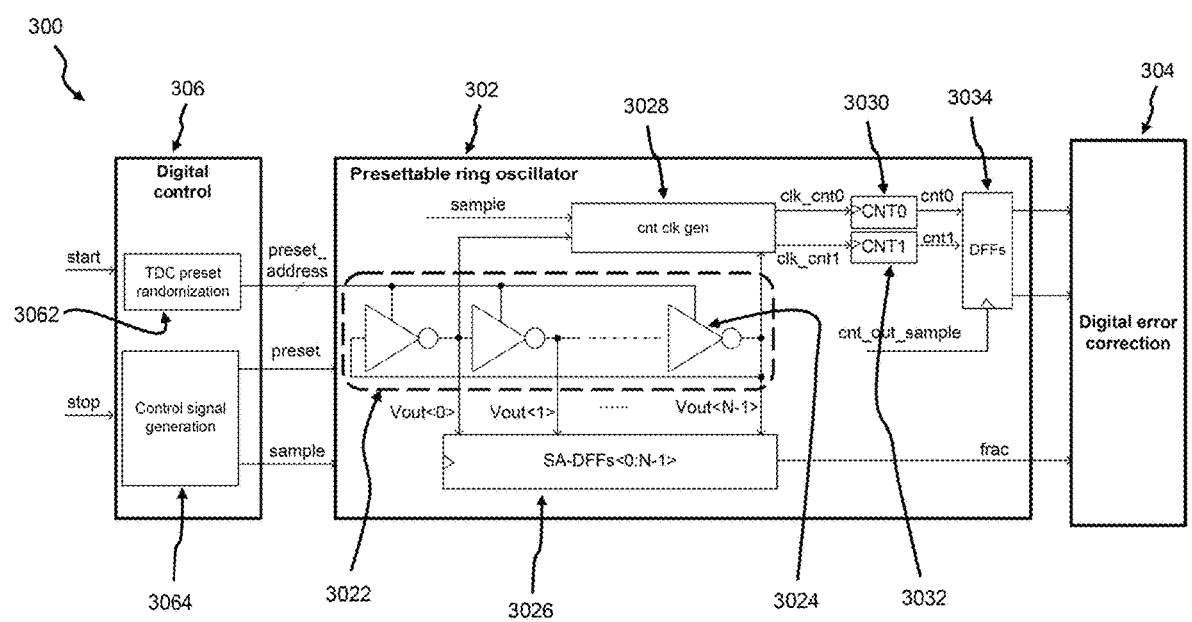
FIG. 3 shows schematics of a proposed TDC, according to an embodiment.

FIG. 3 is a schematic diagram of a proposed time-to-digital converter (TDC) 300, according to an embodiment. The TDC 300 may also be referred to as a recirculating TDC 300. Broadly, the TDC 300 comprises a (presettable) ring oscillator module 302 and a digital error correction module 304. The ring oscillator module 302 is configured to receive a sampling signal, an addressing signal, and a preset signal, and the ring oscillator module 302 includes: a ring oscillator 3022 arranged with a plurality of inverters 3024 (sequentially arranged in N-stages, where N represents the number of stages, e.g. N may be 15); a phase sampler 3026 configured to sample phase signals (i.e. indicated respectively as $V_{out}<0>$, $V_{out}<1>$, ... $V_{out}<N-1>$ in FIG. 3) generated by the inverters 3024 of the ring oscillator 3022 for generating a first output signal (i.e. indicated as frac in FIG. 3), on receipt of the sampling signal; a counter clock generator 3028 (implemented using conventional AND logic gates and) configured to generate first and second clock signals (i.e. indicated respectively as clk_cnt0 and clk_cnt1 in FIG. 3), based on receipt of the sampling signal and respective phase signals generated by the first and last inverters 3024 of the ring oscillator 3022 (i.e. both $V_{out}<0>$ and $V_{out}<N-1>$ are provided to the counter clock generator 3028); first and second counters 3030, 3032 (i.e. indicated as CNT0 and CNT1 in FIG. 3) configured to respectively generate first and second counter output signals (i.e. indicated respectively as cnt0 and cnt1 in FIG. 3), based on receipt of the first and second clock signals respectively; and a data sampler 3034 configured to sample the first and second counter output signals to respectively generate second and third output signals. The digital error correction module 304 is arranged to process the first, second and third output signals for generating a digital signal representative of a time difference between receipt of a start signal and receipt of a stop signal by the TDC 300. Particularly, the digital error correction module 304 is devised to correct a miscounting error arising due to the first and second clock signals (i.e. clk_cnt0 and clk_cnt1) not synchronized with the clock frequency of the start and stop signals (i.e. both signals have the same clock frequency), thereby causing the second and third output signals to be erroneous in that respect. Also, the digital signal is generated in the form of a binary code in this case. Further, it is to be appreciated that the start signal and the stop signal are respectively generated in response to occurrence and termination of an event, in which the time difference between the occurrence and termination is to be measured using the TDC 300.

Further, it is to be appreciated that the counter clock generator 3028 is arranged to stop the phase signals generated by the first and last inverters 3024 that are provided to the counter clock generator 3028, in which the stoppage of the phase signals is performed based on the sampling signal.

Also, the ring oscillator 3022 is arranged to be operated between first and second modes on receipt of the preset signal, in which in the first mode, the ring oscillator 3022 is electrically switched on for a period corresponding to the time difference, and in the second mode, the ring oscillator 3022 is electrically switched off by presetting an inverter 3024 based on the addressing signal, which includes an identification of the inverter 3024 selected to be preset at each conversion cycle of the ring oscillator 3022. That is, the ring oscillator 3022 is switched on and switched off by the preset signal in both said modes.

In one example, the phase sampler 3026 is implemented using a sense-amplifier-based D flip-flops (SA-DFFs) circuit (e.g. using N number of SA-DFFs, and the N in this context has the same value as the number of stages configured for the ring oscillator 3022), while the data sampler 3034 is implemented using a D flip-flops circuit. Also, it is to be appreciated that the first output signal (i.e frac) is a resultant phase signal based upon the phase signals generated by the inverters 3024. More specifically, the first output signal may also be defined in the format of: frac<0; N−1>, and there is a one-to-one mapping with $V_{out}<0; N-1>$. For example, frac<0> is an equivalent sampled value of $V_{out}<0>$, while frac<2> is then an equivalent sampled value of $V_{out}<2>$, so on and so forth, as will be understood.

Not to be construed as limiting, the TDC 300 may optionally further comprise a digital control module 306 arranged to receive the start and stop signals transmitted to the TDC 300. Based on receipt of the start and stop signals, the digital control module 306 is configured to generate the sampling signal, the addressing signal, and the preset signal. Particularly, the digital control module 306 includes: a pseudo-random code generator 3062 (implemented in the form of a TDC preset randomization module) configured to generate the identification (i.e. an N-bit preset_address) to randomly address one of the inverters 3024 of the ring oscillator 3022 selected to be preset at each (time-to-digital) conversion cycle of the ring oscillator 3022; and a control signal generator 3064 configured to generate the sampling signal and the preset signal. So, it is to be appreciated that the digital control module 306 is functionable as a control signal generation block of the TDC 300. Also, the pseudo-random code generator 3062 is configured to perform modulo operations in order to generate the N-bit preset_address. Then, to clarify the definition of "conversion cycle," it is to be noted that the TDC 300 is configured to be operated on two input clocks running at a same frequency. So "conversion cycle" in this context means from the start of a (time-to-digital) conversion to the start of a next immediate (time-to-digital) conversion. Basically, the "conversion cycle" is therefore equal to one clock cycle of an input signal to the TDC 300.

Separately, it is to be appreciated that the N-bit preset_address is linked to the start_code, and there is a one-to-one mapping between the N-bit preset_address and the start_code. The start_code may also be known as the start_phase, which is the initial phase of the ring oscillator 3022, during the preset state (i.e. the second mode). This initial phase is encoded by a TDC encoder to generate a binary code (i.e. the start_code). Also, to clarify, the one-to-one mapping refers to associating the start_code with the N-bit preset_address.

Figure 4:
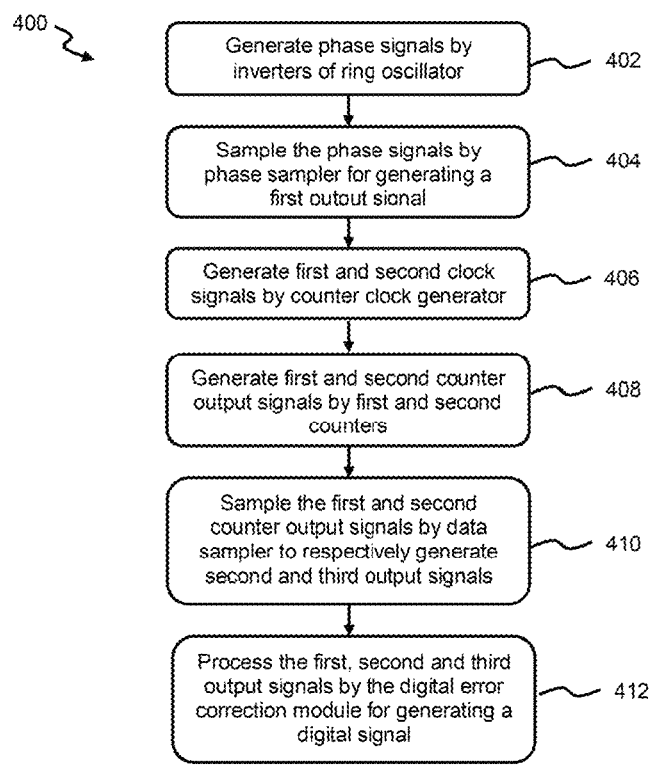
FIG. 4 is a flow diagram of a method of time-to-digital conversion using the TDC of FIG. 3.

A corresponding method of time-to-digital conversion 400 using the TDC 300 is disclosed in a flow diagram of FIG. 4. Broadly, the method 400 comprises: at step 402, generating the phase signals by the inverters 3024 of the ring oscillator 3022; at step 404, sampling the phase signals by the phase sampler 3026 for generating a first output signal (on receipt of the sampling signal by the ring oscillator module); at step 406, generating first and second clock signals by the counter clock generator 3028 (based on receipt of the sampling signal and phase signals generated respectively by the first and last inverters 3024 of the ring oscillator 3022); at step 408, generating first and second counter output signals by the first and second counters 3030, 3032 (based on receipt of the first and second clock signals respectively); at step 410, sampling the first and second counter output signals by the data sampler 3034 to respectively generate second and third output signals; and at step 412, processing the first, second and third output signals by the digital error correction module 304 for generating a digital signal representative of a time difference between receipt of a start signal and receipt of a stop signal by the TDC 300.

The method 400 also includes a step of operating (not shown) the ring oscillator 3022 between first and second modes on receipt of the preset signal, in which in the first mode, the ring oscillator 3022 is electrically switched on for a period corresponding to the time difference, and in the second mode, the ring oscillator 3022 is electrically switched off by presetting an inverter 3024 based on the addressing signal, which includes an identification of the inverter 3024 selected to be preset at each conversion cycle of the ring oscillator 3022.

Figure 5:
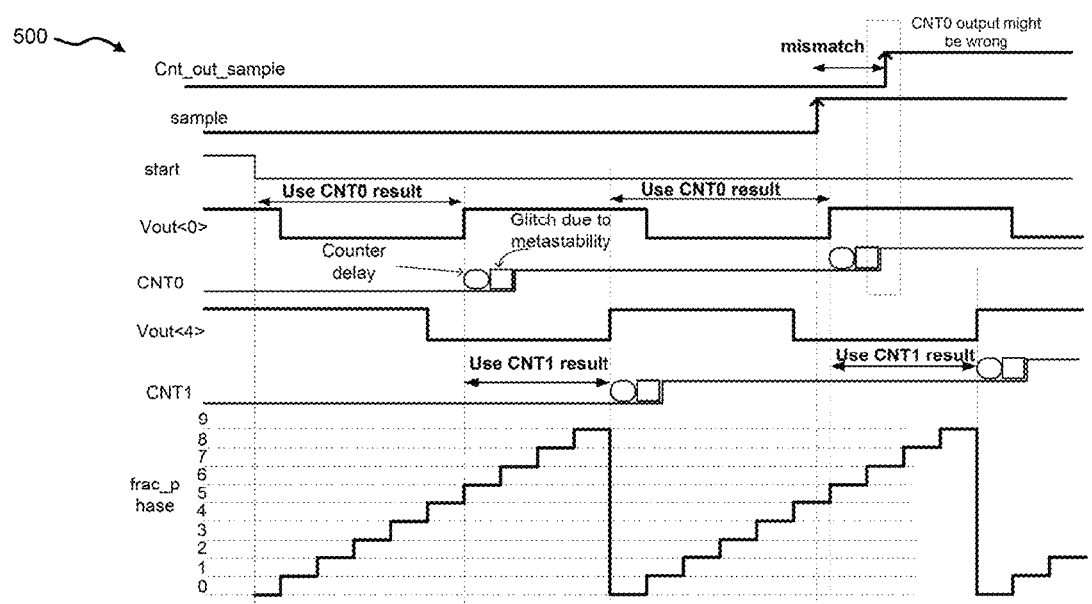
FIG. 5 shows clock timing diagrams illustrating an example of possible errors occurring in a conventional counter output selection method for a 5-stage ring oscillator TDC, according to the prior art.

FIG. 5 shows clock timing diagrams 500 illustrating an example of possible errors occurring in a conventional counter output selection method (not shown) for a 5-stage ring oscillator TDC, according to the prior art. Briefly, depending on the frac_phase state, the counter output (i.e CNT0) that is in the second half of its clock cycle is generally considered error-free, and therefore selected as the final counter value. However, miscounting problem may still manifest in this conventional selection method at the transition of frac_phase from 2N−1 to 0, or from N to N+1. The reason for this may be due to mismatch of ring oscillator phase sampling the SA-DFF clock and counter output sampling DFF clock, in which the said two clock signals are derived from a common source. Nevertheless, due to routing mismatch, different loading, and difference in buffer size, there may be significant mismatch between the two clock signals such that counter output may be ambiguous, as shown in FIG. 5. Additionally, the two sets of DFFs are usually designed with different circuit structures to save power and IC area. Specifically, the SA-DFFs are customized latch-type dynamic comparators that are optimized for power, speed and metastability, whereas the DFFs used to sample counter outputs are normally not optimized as such.

Figure 6A:
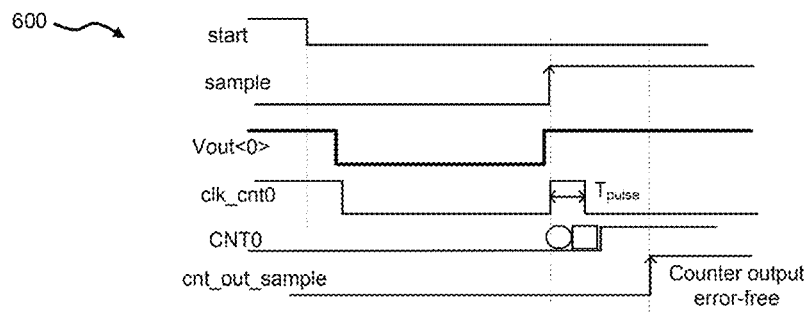
FIGS. 6a and 6b are timing diagrams of a proposed digital error correction method used in the TDC of FIG. 3.
Figure 6B:
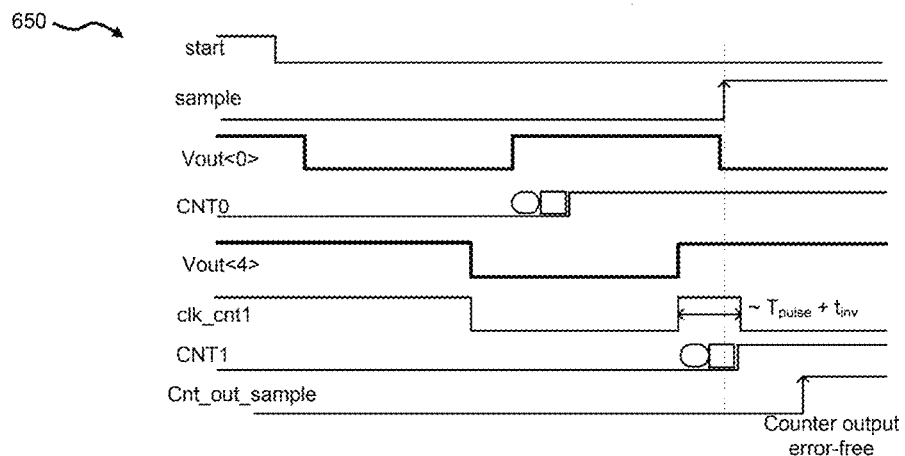
Figure 7:
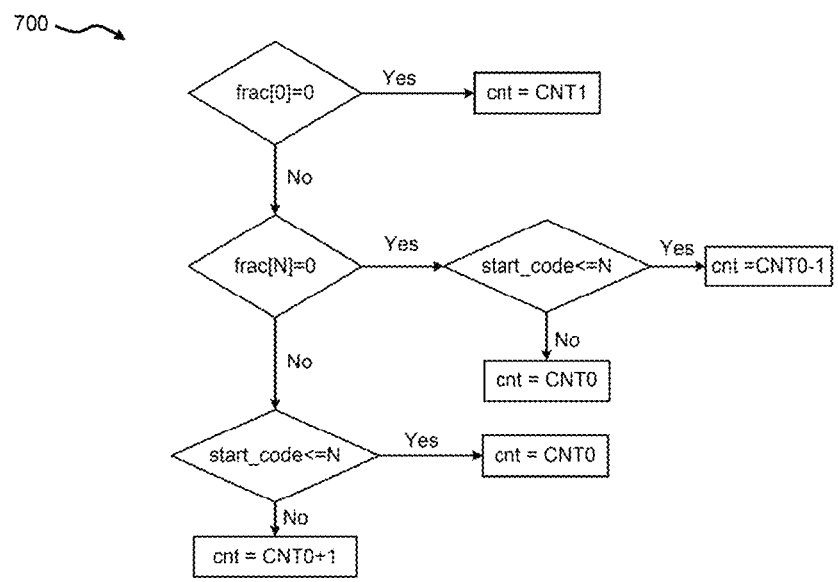
FIG. 7 shows a flow diagram of the proposed digital error correction method.

Therefore, in order to substantially (if not completely) eliminate the possible miscounting problem arising from circuit imperfections, a digital error correction method 700, as depicted in FIG. 7, is hereby proposed to be used in the TDC 300 of FIG. 3, in which the first and second clock signals of the first and second counters 3030, 3032 are arranged to be stopped to allow the first and second counter output signals to settle. It is to be appreciated that stopping the first and second clock signals of the first and second counters 3030, 3032 means that the associated clock signal goes to 0 level at some condition, e.g. when a signal goes from low level to high level. Only when the first and second counter output signals have settled, the outputs of the first and second counters 3030, 3032 are then sampled. Detailed timing diagrams of the digital error correction method 700 are shown in FIGS. 6a and 6b. Particularly, FIGS. 6a and 6b respectively show that when $V_{out}<0>$ is sampled as 1, cnt0 (i.e. the first counter output signal) is then used, and when $V_{out}<0>$ is sampled as 0 instead, cnt1 (i.e. the second counter output signal) is used. It may be seen that when the first and second clock signals are stopped, the outputs of the first and second counters 3030, 3032 stabilize after a short delay. Hence, the cnt_out_sample signal can easily be generated to sample the correct counter outputs. To clarify, it is to be appreciated that the cnt_out_sample signal is the same sampling signal generated by the control signal generator 3064. It is to be noted that a minimum pulse width $T_{pulse}$ is required as depicted in FIG. 6a. This pulse width is the minimum high time of counter clock signal for the first counter 3030 to toggle, and the required value of $T_{pulse}$ may be obtained through simulations performed under different PVT conditions. But in this instance, a programmable delay was used to generate the required $T_{pulse}$ purely for purpose of experimental investigations. Compared with the conventional selection method, the disclosed digital error correction method 700 is much more simplified on the timing requirements. More importantly, counter delay and metastability do not play any role in determining the $T_{pulse}$ requirement, or affect circuit performance. Hence, the disclosed digital error correction method 700 is beneficially more robust against PVT variations.

FIG. 7 shows a flow diagram of the proposed digital error correction method 700 (in which implementation is via a counter output selection and compensation algorithm). Particularly, selection of the first and second counter output signals to be used by the data sampler 3034 is based on values of frac<0> and frac<N>, in which frac<0> and frac<N> are the first and last SA-DFF outputs respectively. If frac<0> is 0, the second counter 3032 (CNT1) is selected; otherwise if the value of if frac<0> is 1 instead, the first counter 3030 (CNT0) is selected. When the first counter 3030 is selected, its associated output needs to be compensated depending on the value of frac<N> together with the start_code of the ring oscillator 3022 in each conversion. To explain, the start_code is a predefined value associated with each inverter 3024 in the ring oscillator 3022. When a different inverter 3024 is (randomly) selected for presetting, its corresponding start_code is then used for calculating the binary code in the digital signal generated by the digital error correction module 304. It is to be appreciated that the start_code is determined by the N-bit preset_address (of the addressing signal), in which the start_code is to be subtracted from the first output signal (i.e. frac).

That means to say, at step 412 of the method 400 of FIG. 4 (which is performed by the digital error correction module 304), step 412 may broadly include: determining if the phase signal generated by the first inverter 3024 has a value of 0 or 1, wherein if the phase signal generated by the first inverter 3024 has a value of 0, the third output signal is selected for processing by the digital error correction module 304, or if the phase signal generated by the first inverter 3024 has a value of 1, the second output signal is selected for processing by the digital error correction module 304, in which the second output signal is further processed using both a value of the phase signal generated by the last inverter 3024 and a predefined value associated with a corresponding inverter 3024 randomly selected to be preset at each conversion cycle of the ring oscillator 3022. It is to be appreciated that the predefined value is further associated with the identification.

Figure 8:
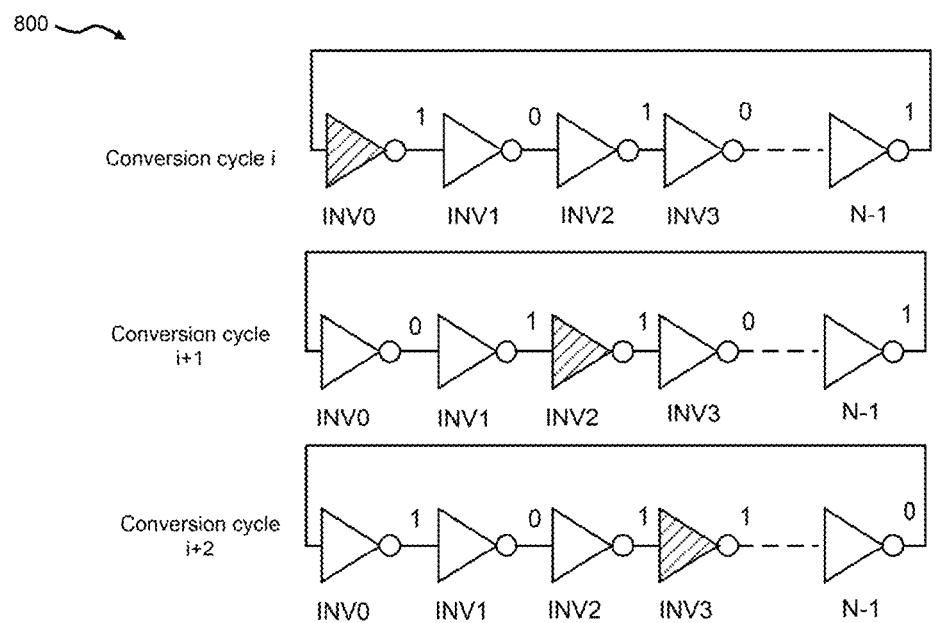
FIG. 8 illustrates random presetting of different inverters of a ring oscillator in the TDC of FIG. 3 at different conversion cycles.
Figure 9:
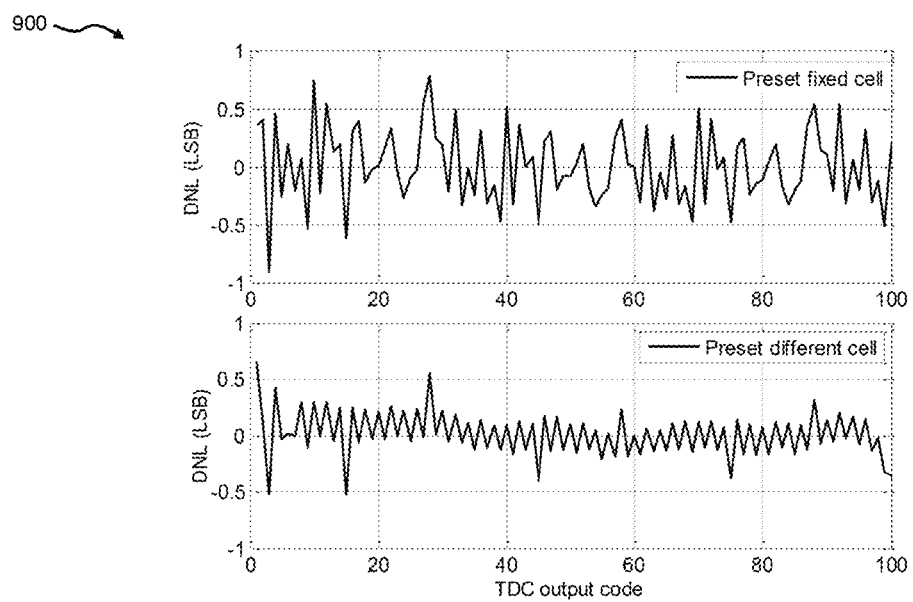
FIG. 9 depicts graphical comparison of measured TDC differential non-linearity (DNL) results.

FIG. 8 illustrates a concept 800 directed at random presetting of different inverters 3024 of the ring oscillator 3022 in the TDC 300 of FIG. 3 at different conversion cycles. When an inverter 3024 is selected to be preset (i.e. to stop electrical operation of the said inverter 3024, which has an effect of causing the ring oscillator 3022 to stop oscillation), both its input and output are at high. When the preset signal is de-asserted, output of the selected inverter 3024 is discharged to low and an oscillation starts. The TDC conversion starts accordingly. When the output of the TDC 300 is sampled, the preset signal goes high and the ring oscillator 3022 stops oscillation. Due to process variation, each inverter stage in the ring oscillator 3022 has different delay (inherently), thereby resulting in TDC non-linearity. So to improve the non-linearity performance of the TDC 300, it is herein proposed to preset a different random inverter 3024 (of the ring oscillator 3022) each time. This is achieved by generating the identification (e.g. device address) of an inverter 3024 through a random process using the pseudo-random code generator 3062. Theoretically, each output of the inverter 3024 has the same probability of hitting the same TDC output code. This is equivalent to imposing an averaging effect of inverter cell mismatch. Accordingly, FIG. 9 depicts graphical comparison 900 of measured TDC differential non-linearity (DNL) results obtained from a conventional method for presetting a fixed inverter (of a ring oscillator), and the proposed method for presetting different random inverters (of a ring oscillator). It can clearly be seen from FIG. 9 that the proposed method effectively reduces TDC non-linearity.

To summarize, the proposed TDC 300 is purposefully devised to have high resolution, large dynamic range, and also only requires a small IC area for actual circuit implementation. The TDC 300 is also configured to use the digital error correction method 700 to resolve the counter miscounting problem and provide an error free output (generated by the digital error correction module 304). Specifically, the digital error correction method 700 is configured to deliberately stop the clocks of the first and second counters 3030, 3032, when a stop signal is received by the TDC 300. In this manner, outputs of the first and second counters 3030, 3032 do not change until reset, and so outputs of the first and second counters 3030, 3032 can be sampled when the outputs have settled. It is to be appreciated that two counters 3030, 3032 are used in the TDC 300 to detect the first-half and second-half ring oscillator cycles and the correct counter output in the error-free region is always selected (and it is to be appreciated that this method is applicable to all types of oscillator-based TDCs as well).

Further, the said TDC 300 can be electrically stopped when the ring phase and counter output are read out properly, thus resulting in low power operation. This is by virtue of the ring oscillator 3022 being arranged to be preset to different phase state at different conversion cycles. Each inverter 3042 in the ring oscillator 3022 has a same probability to be preset, regardless of the input to the TDC 300. Hence, the TDC linearity of the TDC 300 is improved due to the averaging effect.

While the disclosure has been illustrated and described in detail in the drawings and foregoing description, such illustration and description are to be considered illustrative or exemplary, and not restrictive; the disclosure is not limited to the disclosed embodiments. Other variations to the disclosed embodiments can be understood and effected by those skilled in the art in practising the claimed disclosure.

For example, in certain instances, the digital control module 306 may also be included as part of the TDC 300 of FIG. 3. Further, the N-bit preset_address may also be predefined as a fixed value, instead of being randomly selected using the pseudo-random code generator 3062. That is, a user of the TDC 300 may provide the fixed value for the N-bit preset_address to determine which inverter 3024 to be preset. Particularly, a same inverter 3024 is arranged to be preset at every conversion cycle under this variation. Accordingly, the pseudo-random code generator 3062 is thus switched off in this instance, and not in use operatively. This also means that the start_code will change accordingly, due to change in the N-bit preset_address. In one example, the start_code may be arranged to take on a zero value.

Figure 10:
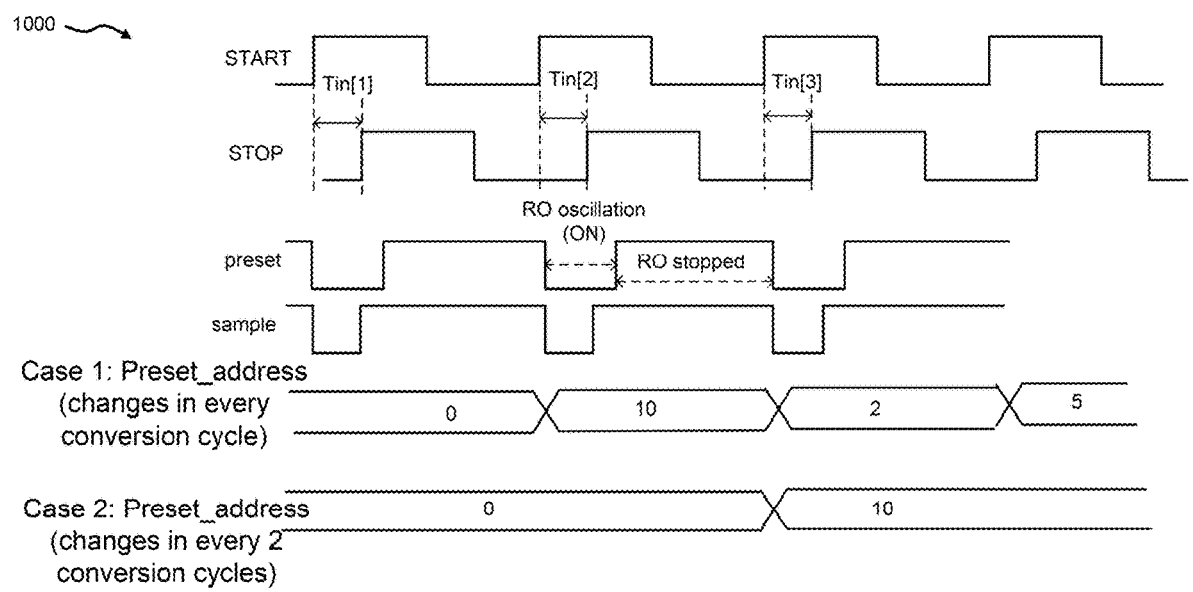
FIG. 10 depicts timing diagrams of the TDC of FIG. 3, when configured to be operated using a varying preset_address scheme.
Figure 11:
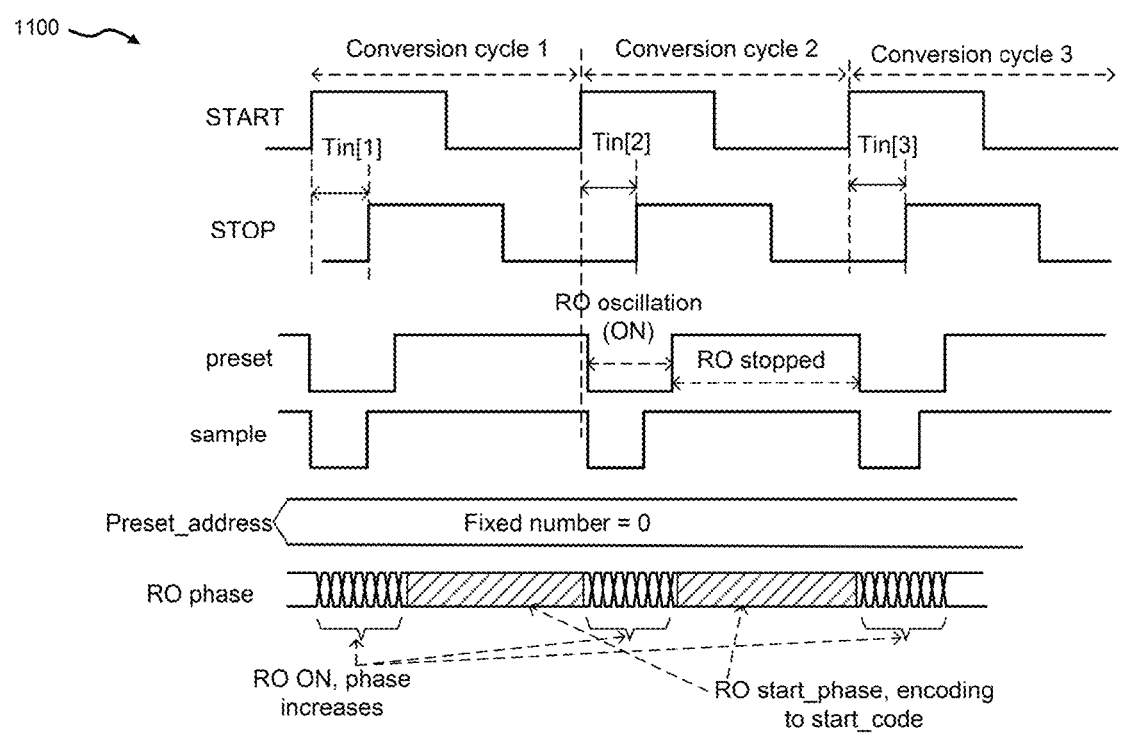
FIG. 11 depicts timing diagrams of the TDC of FIG. 3, when configured to be operated using a fixed preset_address scheme.

To illustrate, FIG. 10 depicts timing diagrams of the TDC 300 of FIG. 3, when configured to be operated using a varying preset_address scheme. It may be observed that the rate of change of varying the N-bit preset_address is also programmable, i.e. two examples are shown in FIG. 10. Other rates of change are possible too, such as varying in every 4 cycles or 8 cycles. On the other hand, FIG. 11 depicts timing diagrams of the TDC 300 of FIG. 3, when configured to be operated using a fixed preset_address scheme. It may be seen that the N-bit preset_address is arranged to be of a fixed value for every conversion cycle. Moreover, the N-bit preset_address need not be set to 0 in every case. Indeed, the N-bit preset_address may take on a value from the range 0 to N−1 (i.e. 0≤preset_address≤N−1), where N is a number of inverters 3024 arranged in the ring oscillator 3022.

What is claimed is:
1. A time-to-digital converter (TDC) comprising:
a ring oscillator module configured to receive a sampling signal, an addressing signal, and a preset signal, wherein the ring oscillator module includes:
(i) a ring oscillator arranged with a plurality of inverters;
(ii) a phase sampler configured to sample phase signals generated by the plurality of inverters of the ring oscillator for generating a first output signal, on receipt of the sampling signal;
(iii) a counter clock generator configured to generate a first clock signal and a second clock signal, based on receipt of the sampling signal and phase signals generated by a first inverter and a last inverter of the ring oscillator, respectively;
(iv) a first counter and a second counter configured to generate a first counter output signal and a second counter output signal, respectively, based on receipt of the first clock signal and the second clock signal, respectively; and
(v) a data sampler configured to sample the first counter output signal and the second counter output signal to generate a second output signal and a third output signal, respectively; and
a digital error correction module arranged to process the first output signal, the second output signal, and the third output signal for generating a digital signal representative of a time difference between receipt of a start signal and receipt of a stop signal by the TDC, wherein the ring oscillator is arranged to be operated between a first mode and a second mode on receipt of the preset signal, wherein the ring oscillator is electrically switched on for a period corresponding to the time difference in the first mode, and in the second mode, the ring oscillator is electrically switched off by presetting an inverter identified based on the addressing signal.

2. The TDC of claim 1, wherein the data sampler includes a D flip-flops circuit.

3. The TDC of claim 1, wherein the phase sampler includes a sense-amplifier-based D flip-flops circuit.

4. The TDC of claim 1, wherein the first output signal includes a resultant phase signal based upon the phase signals generated by the plurality of inverters.

5. The TDC of claim 1, further comprising a digital control module arranged to receive the start signal and the stop signal for generating the sampling signal, the addressing signal, and the preset signal, wherin the digital control module includes:
a pseudo-random code generator configured to generate the addressing signal to randomly address one of the inverters of the ring oscillator as the inverter identified to be preset; and
a control signal generator configured to generate the sampling signal and the preset signal.

6. The TDC of claim 1, wherein the addressing signal is predetermined to preset a same inverter at each conversion cycle.

7. The TDC of claim 1, wherein the digital error correction module is configured to perform the following step for processing the first output signal, the second output signa, and the third output signal:
determining a value of the phase signal generated by the first inverter,
wherein, if the phase signal generated by the first inverter has a value of 0, the third output signal is selected for processing by the digital error correction module, or, if the phase signal generated by the first inverter has a value of 1, the second output signal is selected for processing by the digital error correction module, and wherein the second output signal is further processed using both a value of the phase signal generated by the last inverter and a predefined value associated with a corresponding inverter selected to be preset at each conversion cycle of the ring oscillator.

8. The TDC of claim 1, wherein the counter clock generator is configured to stop the phase signals generated by the first and last inverters that are provided to the counter clock generator, and wherein stoppage of the phase signals is performed based on the sampling signal.

9. A method of time-to-digital conversion, the method comprising:
(i) generating phase signals by a plurality of inverters of a ring oscillator that includes a plurality of inverters;
(ii) responsive to a sampling signal, sampling the phase signals to generate a first output signal; (iii) generating, by a counter clock generator, a first clock signal and a second clock signal, based on receipt of the sampling signal and phase signals generated by a first inverter and a last inverter of the ring oscillator, respectively;
(iv) generating a first counter output signal and a second counter output signal, based on receipt of the first clock signal and the second clock signal, respectively; (v) sampling the first counter output signal and the second counter output signal to generate a second output signal and a third output signal, respectively; and (vi) processing the first output signal, the second output signal, and the third output signal to generate a digital signal representative of a time difference between receipt of a start signal and receipt of a stop signal, wherein the method further includes operating the ring oscillator between a first mode and a second mode based on the preset signal, wherein the ring oscillator is electrically switched on for a period corresponding to the time difference in the first mode, and the ring oscillator is electrically switched off by presetting an inverter identified based on the addressing signal in the second mode.

10. The method of claim 9, wherein step (vi) includes:
determining a value of the phase signal generated by the first inverter,
wherein, if the phase signal generated by the first inverter has a value of 0, the third output signal is selected for processing by the digital error correction module, or, if the phase signal generated by the first inverter has a value of 1, the second output signal is selected for processing by the digital error correction module, and wherein the second output signal is further processed using both a value of the phase signal generated by the last inverter and a predefined value associated with a corresponding inverter selected to be preset at each conversion cycle of the ring oscillator.

11. A time-to-digital converter (TDC) comprising:
a ring oscillator module configured to receive a sampling signal, an addressing signal, and a preset signal, the ring oscillator module includes:
(i) a ring oscillator arranged with a plurality of inverters;
(ii) a phase sampler configured to sample phase signals generated by the plurality of inverters of the ring oscillator for generating a first output signal, on receipt of the sampling signal;
(iii) a counter clock generator configured to generate a first clock signal and a second clock signal, based on receipt of the sampling signal and phase signals generated by a first inverter and a last inverter of the ring oscillator, respectively;
(iv) a first counter and a second counter configured to generate a first counter output signal and a second counter output signal, respectively, based on receipt of the first clock signal and the second clock signal, respectively; and
(v) a data sampler configured to sample the first counter output signal and the second counter output signal to generate a second output signal and a third output signal;

a digital error correction module arranged to process the first output signal, the second output signal, and the third output signal for generating a digital signal representative of a time difference between receipt of a start signal and receipt of a stop signal by the TDC, wherein the ring oscillator is arranged to be operated between a first mode and a second mode based on the preset signal, and wherein the ring oscillator is electrically switched on for a period corresponding to the time difference in the first mode, and the ring oscillator is electrically switched off by presetting an inverter identified based on the addressing signal in the second mode; and a digital control module arranged to receive the start signal and the stop signal, wherein the digital control module includes:
(vi) a pseudo-random code generator configured to randomly address one of the inverters of the ring oscillator selected to be preset; and
(vii) a control signal generator configured to generate the sampling signal and the preset signal.

\* \* \* \* \*

UNITED STATES PATENT AND TRADEMARK OFFICE
CERTIFICATE OF CORRECTION

PATENT NO. : 11,042,126 B2  
APPLICATION NO. : 16/900452  
DATED : June 22, 2021  
INVENTOR(S) : Yuan et al.

Page 1 of 1

It is certified that error appears in the above-identified patent and that said Letters Patent is hereby corrected as shown below:

In the Claims

Claim 7: Column 11, Line 34: "processing the first output signal, the second output signa," should read -- processing the first output signal, the second output signal, --.

Signed and Sealed this  
Ninth Day of August, 2022

Katherine Kelly Vidal  
*Director of the United States Patent and Trademark Office*